United States Patent
Michna et al.

(10) Patent No.: US 12,004,317 B2
(45) Date of Patent: Jun. 4, 2024

(54) COMPUTING SYSTEM HAVING A FLEXIBLE FILTER ASSEMBLY

(71) Applicant: HEWLETT PACKARD ENTERPRISE DEVELOPMENT LP, Houston, TX (US)

(72) Inventors: Vincent W. Michna, Houston, TX (US); Martha Gomez, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 222 days.

(21) Appl. No.: 17/731,415

(22) Filed: Apr. 28, 2022

(65) Prior Publication Data
US 2023/0354542 A1    Nov. 2, 2023

(51) Int. Cl.
*H05K 7/14*    (2006.01)
*G06F 1/20*    (2006.01)
*G08B 21/18*    (2006.01)
*H05K 7/20*    (2006.01)

(52) U.S. Cl.
CPC ............. *H05K 7/1487* (2013.01); *G06F 1/20* (2013.01); *G08B 21/182* (2013.01); *H05K 7/1489* (2013.01); *H05K 7/20145* (2013.01); *H05K 7/20727* (2013.01); *H05K 7/20836* (2013.01)

(58) Field of Classification Search
CPC .............. H05K 7/1487; H05K 7/1489; H05K 7/20145; H05K 7/20727; H05K 7/20836; G06F 1/20; G08B 21/182
See application file for complete search history.

(56) References Cited

U.S. PATENT DOCUMENTS

| | | | |
|---|---|---|---|
| 10,751,658 B2 | 8/2020 | Gupta et al. | |
| 2002/0147932 A1 | 10/2002 | Brock et al. | |
| 2004/0201485 A1 | 10/2004 | Dermody | |
| 2010/0271563 A1* | 10/2010 | Oda ..................... | G03B 21/145 348/789 |
| 2012/0319851 A1 | 12/2012 | Hoglund et al. | |
| 2020/0015386 A1* | 1/2020 | Gupta .................. | H05K 7/1401 |

FOREIGN PATENT DOCUMENTS

CN      101753317 A     6/2010

* cited by examiner

*Primary Examiner* — Mukundbhai G Patel
(74) *Attorney, Agent, or Firm* — Hewlett Packard Enterprise Patent Department

(57) ABSTRACT

Example implementations relate to a computing system having a flexible filter assembly. The computing system includes a chassis having an internal volume, a pair of guide rails, a flexible filter assembly, and a plurality of first electronic components. The pair of guide rails is disposed spaced apart from each other and coupled to the chassis. The flexible filter assembly is disposed within and connected to the chassis via the pair of guide rails. The flexible filter assembly splits the internal volume into first and second volume portions. The first volume portion is located downstream relative to flow of supply air. The flexible filter assembly slides into the chassis along the pair of guide rails to detachably connect to the chassis. The flexible filter assembly cleans the supply air and directs clean air towards the plurality of first electronic components disposed in the first volume portion and coupled to the chassis.

20 Claims, 9 Drawing Sheets

COMPUTING SYSTEM HAVING A FLEXIBLE FILTER ASSEMBLY

BACKGROUND

Many of today's high-speed, high-power electronic components of a computing system may generate significant amounts of waste heat while executing one or more workloads of the customer. To prevent overheating, the computing system often has a cooling system, which includes cooling equipment, such as fans, heatsinks, or the like. Generally, fans blow air over the heatsinks to dissipate the waste heat from the electronic components. However, airborne dust can reduce cooling efficiency in the computing system by fouling the cooling equipment and airflow paths. Thus, airflow from fans to the heatsink may be reduced, thereby increasing the likelihood of overheating of the electronic components and the need to shut down the computing system to clean the dust from the cooling equipment and airflow paths. Hence, dust filters are used to filter dust from the supply of air, and thereby prevent the overheating problem associated with the electronic components due to dust fouling. Typically, the dust filters are installed at the air inlet side (e.g., a front side) of the computing system to trap dust from the supply air and generate clean air. Accordingly, clean air can be made available to the downstream cooling equipment.

BRIEF DESCRIPTION OF THE DRAWINGS

Various examples will be described below with reference to the following figures.

DETAILED DESCRIPTION

Figure 1:
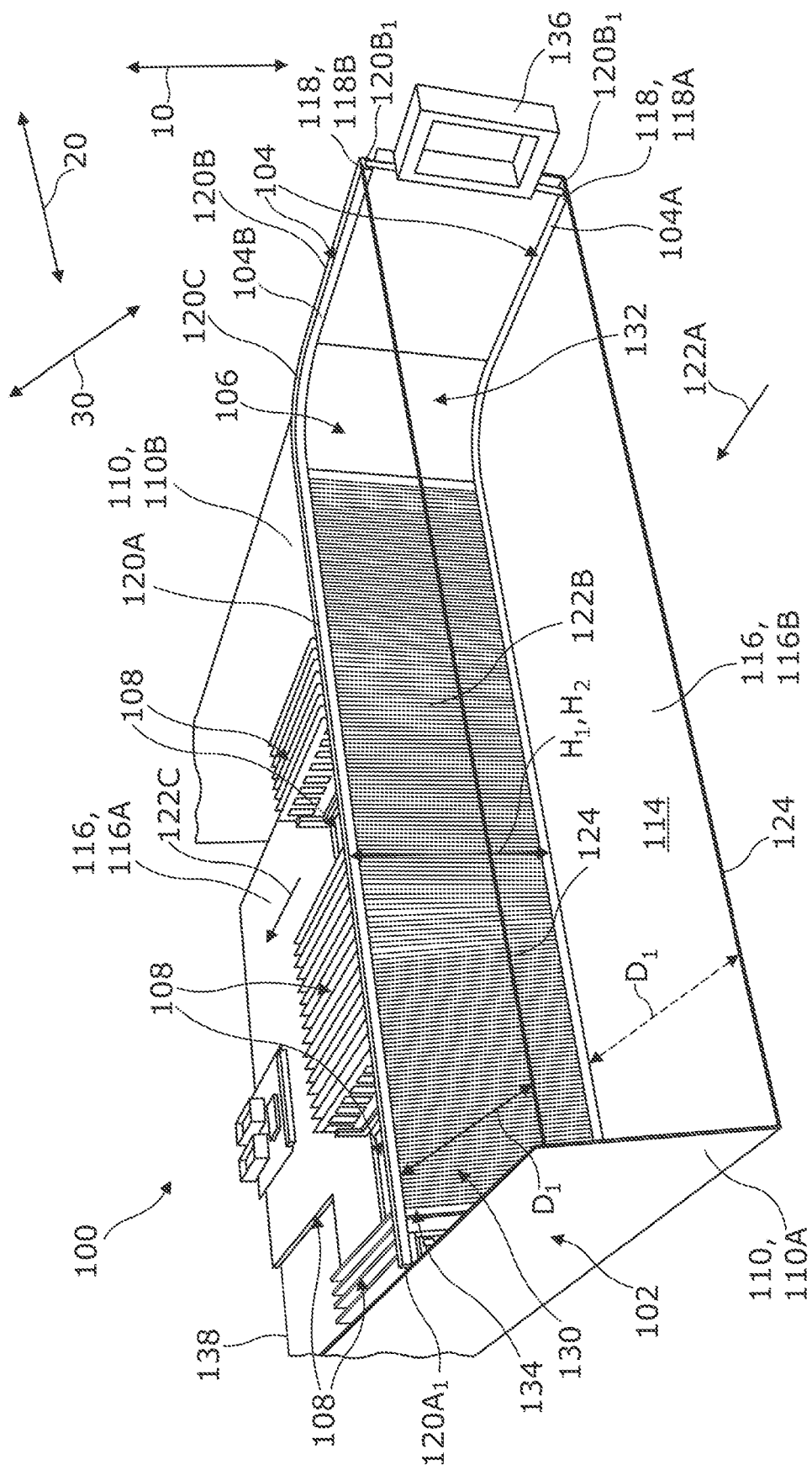
FIG. 1 illustrates a perspective front view of a portion of a computing system having a flexible filter assembly and a plurality of first electronic components according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing examples only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, and/or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

For purposes of explanation, certain examples are described with reference to the components or elements illustrated in FIGS. 1-7. The functionality of the illustrated components or elements may overlap, however, and may be present in a fewer or greater number of components or elements. Further, all or part of the functionality of the illustrated elements may co-exist or be distributed among several geographically dispersed locations. Moreover, the disclosed examples may be implemented in various environments and are not limited to the illustrated examples. Further, the sequence of operations performed for releasably clamping a first electronic device to a second electronic device using a mechanical clamp described in connection with FIG. 7, is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Datacenters generally have multiple computing systems, such as server systems, switches, drive arrays, communication systems, or the like. Each computing system includes electronic components that generate significant amounts of waste heat while executing one or more workloads. Therefore, the computing system often includes an air cooling system, which has cooling equipment, such as fans, heatsinks, or the like to dissipate the waste heat from the electronic components. Typically, fans are configured to blow air over the heatsinks to dissipate the waste heat from the electronic components. However, the computing system deployed either in the data center or outdoor environment is exposed to airborne dust. For example, when fans blow air over the cooling equipment over a long period, dust may foul the heat sinks and airflow paths that are defined between the fans and the heat sinks. In particular, dust may get trapped on fan blades, accumulate over the heatsinks, or block the airflow paths. Thus, reducing the thermal performance (or cooling efficiency) of the heat sinks over time, and may even lead to thermal failure of the computing system. Accordingly, the computing system may be forced to undergo an avoidable shutdown to clear dust from the heat sinks and the airflow paths.

To avoid the computing system being shut down due to thermal failure, a dust filter may be used to trap dust in the supply of air. For example, the dust filter may be disposed at the air inlet side (e.g., a front side) of the computing system to receive air supply. Accordingly, the dust filter may trap dust from the air supply and clean air can be made available to fans to blow over the heatsinks. However, the dust filter may also get blocked over time by accumulation of dust. The blocked dust filter may obstruct the flow of air into the computing system. Thus, the thermal performance of the heat sinks may get reduced over time and may even lead to thermal failure. Accordingly, the computing system may be forced to undergo shut down to replace (or clean) the blocked filter. Additionally, the computing system may have to be disassembled, e.g., by removing at least a front panel or a top panel of the computing system, to access an interior of a chassis for replacing the blocked dust filter. Further, the dust filter disposed at the front side of the computing system may additionally block access to hot-swappable electronic components of the computing system. Thus, the dust filter may need to be removed for accessing the hot-swappable electronic components.

A technical solution to the aforementioned problems may include providing a computing system with a flexible filter assembly. The flexible filter assembly may easily slide into an internal volume of a chassis of the computing system, from outside of the chassis to detachably connect to the chassis. The flexible filter assembly may split the internal volume of the chassis into a first volume portion and a second volume portion. The first volume portion may be located downstream relative to a flow of air into the chassis. For example, the flexible filter assembly may position at an offset distance from the front side of the chassis to define i) the second volume portion between the front side of the chassis and the flexible filter assembly, and ii) the first volume portion between the flexible filter assembly and a rear side of the chassis. In such examples, a plurality of first electronic components (e.g., main components of the computing system) may be disposed in the first volume portion and a plurality of second electronic components (e.g., hot-swappable components) may be disposed in the second volume portion.

Further, the computing system may include a microcontroller coupled to the flexible filter assembly to track an active runtime of the computing system and send signals to a manageability controller of the computing system. The manageability controller may trigger a service event alert for the replacement of the flexible filter assembly in response to determining that the active runtime exceeds a threshold runtime of the computing system. Similarly, the computing system may include temperature sensors to detect temperature in the first and second volume portions and send signals to the manageability controller. The manageability controller may trigger the service event alert for replacement of the flexible filter assembly in response to determining that a difference between the temperature in the first and second volume portions is greater than a threshold temperature. Similarly, the computing system may include airflow sensors to detect airflow in the first and second volume portions and send signals to the manageability controller. The manageability controller may trigger the service event alert for replacement of the flexible filter assembly in response to determining that a difference between the speed in the first and second volume portions is less than a threshold speed.

Since the flexible filter assembly slides into the chassis to detachably connect to a chassis of the computing system from outside of the chassis, the computing system need not undergo shut down or be disassembled to i) connect the flexible filter assembly to the chassis and/or ii) disconnect the flexible filter assembly from the chassis. Further, since the flexible filter assembly is located at an offset distance from a front side of the computing system, it may provision the plurality of second electronic components (e.g., hot-swappable components) to be easily installed in the second volume portion and remain accessible via the front side of the chassis. Additionally, since the manageability controller triggers a service event alert to replace a blocked flexible filter assembly, the computing system need not undergo shut down due to overheating of the first electronic components that is caused by a blocked flexible filter assembly.

Accordingly, the present disclosure describes example implementations of a computing system having a flexible filter assembly. The computing system further includes a chassis having an internal volume, a pair of guide rails, and a plurality of first electronic components. The pair of guide rails are disposed spaced apart from each other along a first direction of the chassis and coupled to the chassis. The flexible filter assembly is disposed within and connected to the chassis via the pair of guide rails. The flexible filter assembly splits the internal volume into a first volume portion and a second volume portion. The first volume portion is located downstream relative to a flow of air into the chassis. The flexible filter assembly slides into the chassis along the pair of guide rails to detachably connect to the chassis. The plurality of first electronic components is disposed in the first volume portion and coupled to the chassis. The flexible filter assembly cleans the flow of air and directs clean air towards the plurality of first electronic components.

Figure 2:
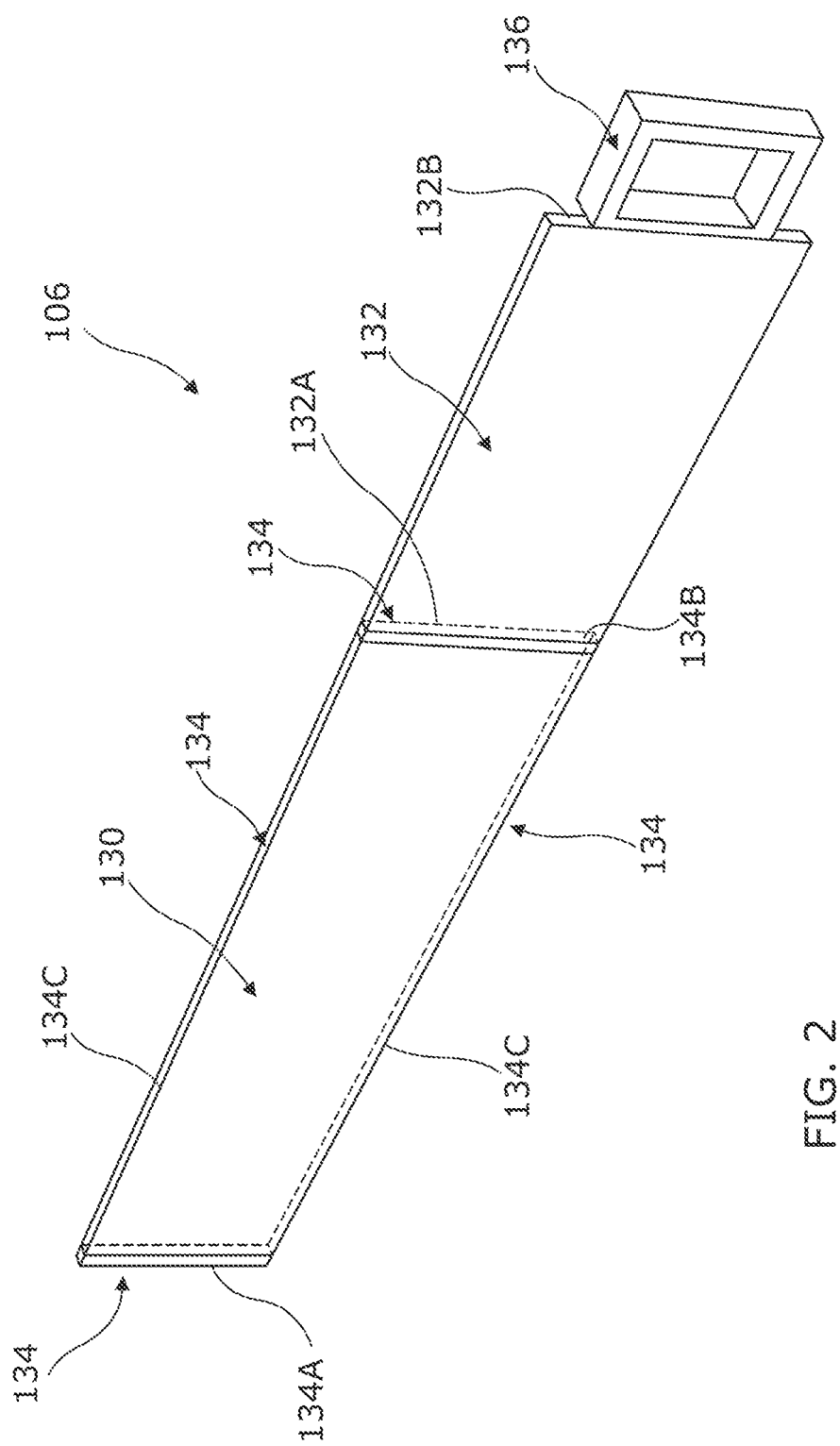
FIG. 2 illustrates a perspective side view of the flexible filter assembly of FIG. 1 according to the example implementation of the present disclosure.

Turning to the Figures, FIG. 1 depicts a portion of a computing system 100. FIG. 2 depicts a perspective view of a flexible filter assembly 106 disposed in the computing system of FIG. 1. In the description hereinafter, FIGS. 1 and 2 are described concurrently for ease of illustration. In some examples, the computing system 100 may be hosted in a rack or a cabinet of a data center (not shown). In some other examples, the computing system 100 may be hosted in an outdoor environment. In one or more examples, the computing system 100 may be a server system, switches, drive arrays, communication systems, or the like without deviating from the scope of the present disclosure.

Figure 3A:
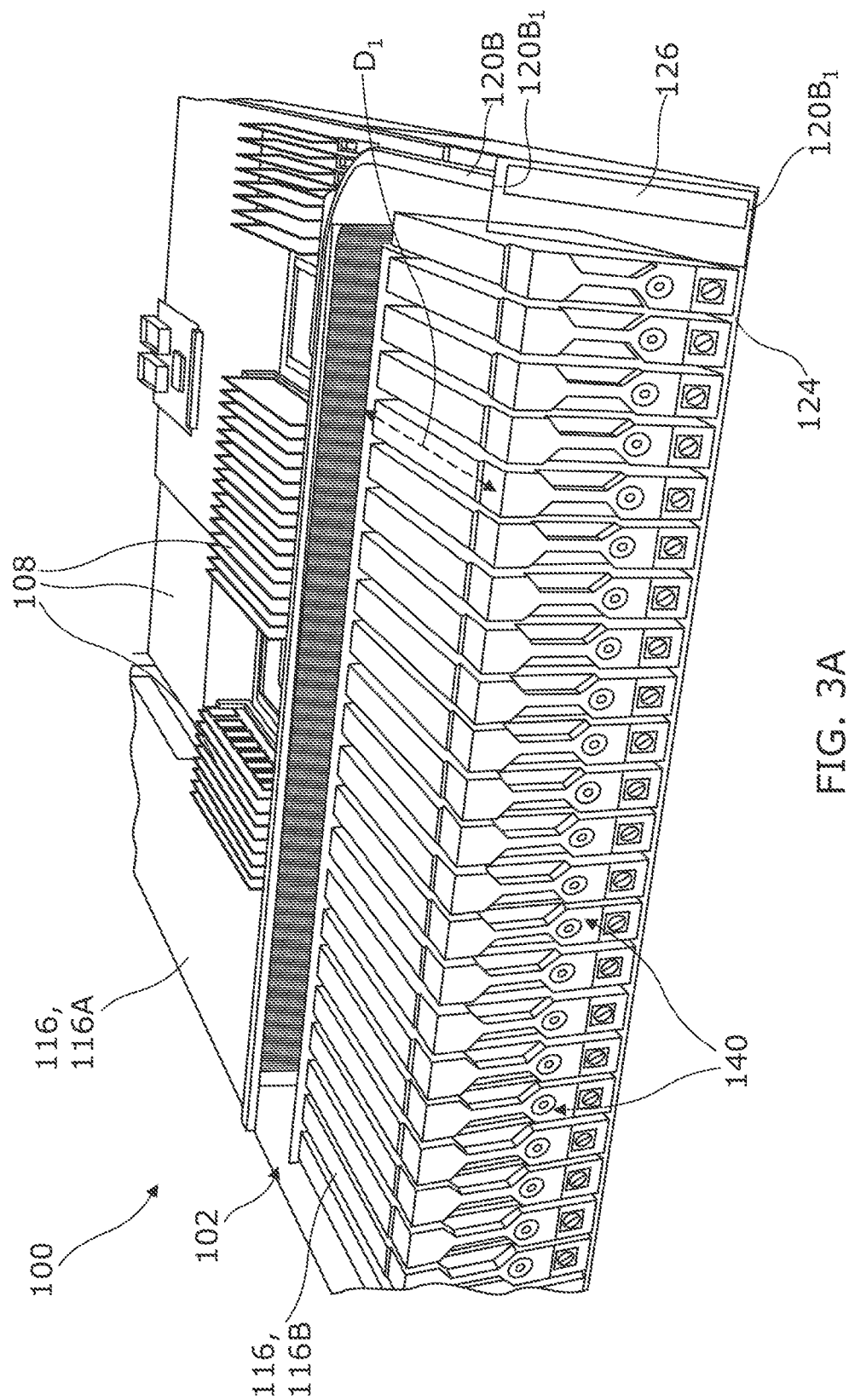
FIG. 3A illustrates a perspective front view of the portion of the computing system of FIG. 1 having a plurality of second electronic components according to the example implementation of the present disclosure.
Figure 3B:
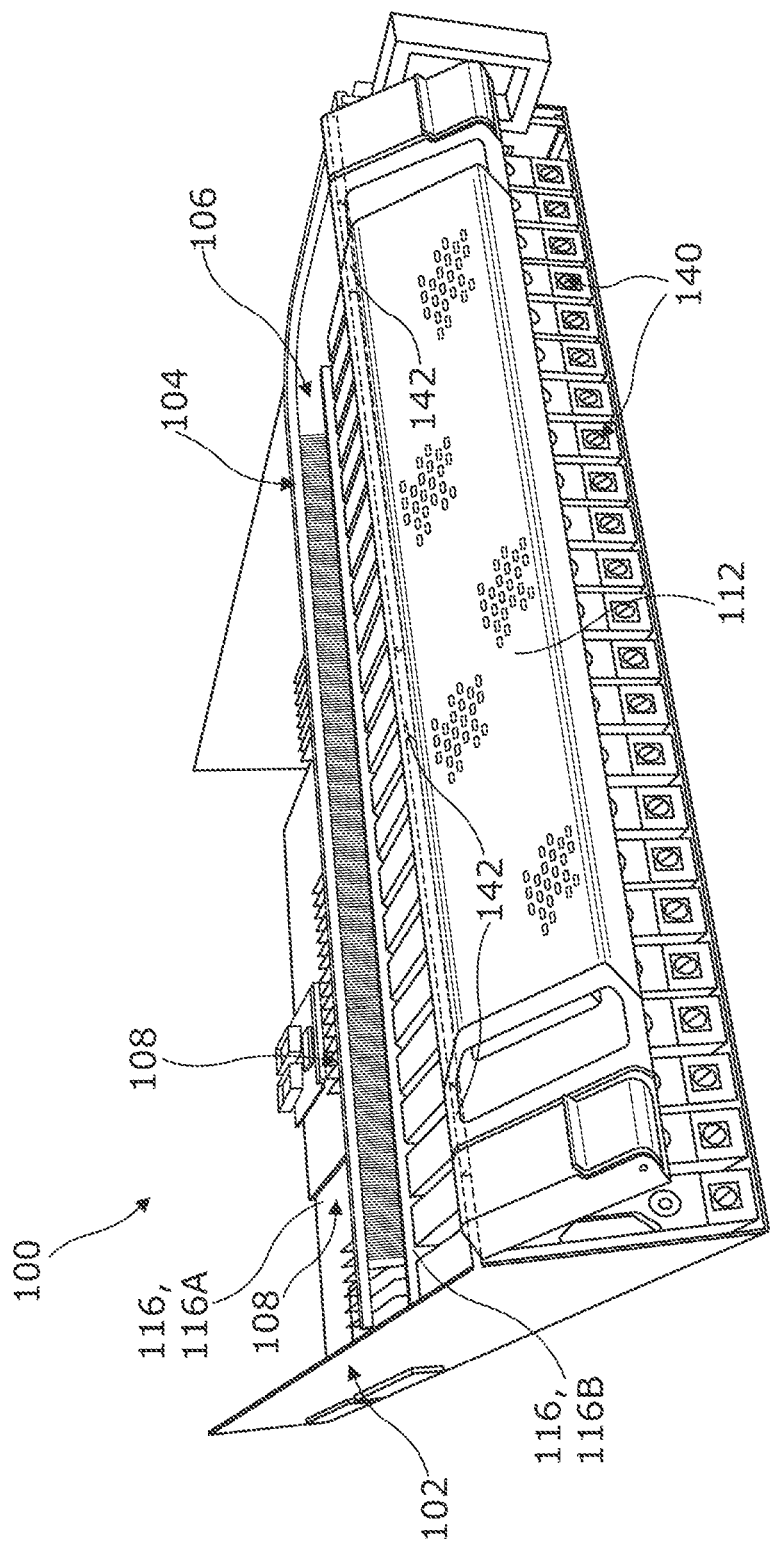
FIG. 3B illustrates a perspective front view of the portion of the computing system of FIG. 3A having a front panel disposed at a front side of the computing system according to the example implementation of the present disclosure.

The computing system 100 includes a chassis 102, a pair of guide rails 104, a flexible filter assembly 106, and a plurality of first electronic components 108. The chassis 102 may be a box-shaped enclosure formed by a plurality of panels, such as a pair of sidewalls 110, a front panel 112 (as shown in FIG. 3B), a rear panel (not shown), a base 114, and a cover (not shown). It may be noted herein that the front panel, the rear panel, and the cover are not shown for ease of illustration of other components of the computing system 100. In one or more examples, the plurality of panels are connected to define an internal volume 116 of the chassis 102.

The pair of guide rails 104 are tracks, which are used to direct the flexible filter assembly 106 to move (e.g., slide) into or out of the chassis 102 from outside of the chassis 102 and to position the flexible filter assembly 106 inside the chassis 102. In some examples, the pair of guide rails 104 are disposed spaced apart from each other along a first direction 10 of the chassis 102 and coupled to the chassis 102. For example, a first guide rail 104A of the pair of guide rails 104 are coupled to the base 114 and a second guide rail 104B of the pair of guide rails 104 may be coupled to the cover (not shown). In some examples, the first direction 10 is a vertical direction of the computing system 100. Each guide rail of the pair of guide rails 104 has a channel 118. In some examples, a first channel 118A of the first guide rail 104A and a second channel 118B of the second guide rail 104B are disposed facing each other to receive the flexible filter assembly 106, and direct the flexible filter assembly 106 to slide into the chassis 102 and position the flexible filter assembly 106 inside the chassis 102. In some examples, channel 118 may be a U-shaped channel, a C-shaped channel, or the like. In one or more examples, each guide rail of the pair of guide rails 104 may be a rigid component.

In one or more examples, each guide rail of the pair of guide rails 104 includes a first section 120A extending along a second direction 20 of the chassis 102, a second section 120B extending along a third direction 30 of the chassis 102, and a third curved section 120C interconnecting the first section 120A and the second section 120B. In some examples, the second direction 20 is a horizontal direction of the computing system 100, and the third direction 30 is a direction which is perpendicular to the second direction 20. It may be noted herein that the third direction 30 may also be referred to as a "longitudinal direction" of the computing system 100, along which supply air 122A is directed into the computing system 100. In some examples, the first section 120A of each guide rail of the pair of guide rails 104 is positioned at a first offset distance "$D_1$" from a front side 124 of the chassis 102. In some examples, the first offset distance "$D_1$" may have a length that is substantially equal to a length of a second electronic component, for example, a hot-swappable electronic component (not shown in FIGS. 1 and 2). In some examples, the hot-swappable components may include hard drives. In some examples, the hot-swappable components may include fans. In some examples, the first section 120A of each guide rail of the pair of guide rails 104 has an open end $120A_1$ disposed adjacent to a first sidewall 110A of the pair of sidewalls 110. The open end $120A_1$ may be facing the first sidewall 110A. Further, the second section 120B of each guide rail of the pair of guide rails 104 is positioned adjacent to a second sidewall 110B of the pair of sidewalls 110 of the chassis 102. The second section 120B of each guide rail of the pair of guide rails 104 has an open end $120B_1$ disposed at the front side 124 of the chassis 102. In some examples, the open end $120B_1$ of the first guide rail 104A and the open end $120B_1$ of the second guide rail 104B may be facing outside of the chassis 102 to define a slot 126 (as shown in FIG. 3A) at the front side 124 of the chassis 102. In some examples, the flexible filter assembly 106 may slide into or out of the chassis 102 via the slot 126. In some examples, the third curved section 120C of each guide rail of the pair of guide rails 104 is positioned adjacent to the second sidewall 110B of the pair of sidewalls 110 of the chassis 102.

The flexible filter assembly 106 may filter the supply air 122A entering from the inlet side (e.g., the front side 124) of the computing system 100. In some examples, the flexible filter assembly 106 is disposed within and connected to the chassis 102 via the pair of guide rails 104. Referring to FIG. 2, the flexible filter assembly 106 includes a flexible filter 130, a flexible driver 132, a flexible frame 134, and a handle 136. The flexible frame 134 surrounds the flexible filter 130, the flexible driver 132 is connected to the flexible filter 130 via the flexible frame 134, and the handle 136 is connected to the flexible driver 132.

In some examples, the flexible filter 130 may be made of a polyurethane foam material having an open cell to trap the dust 122B in the supply air 122A and generate clean air 122C. The flexible filter 130 has a rectangular shaped-structure, to allow the flexible filter assembly 106 to easily slide into and out of the chassis 102 and occupy substantially less space in the internal volume 116 of the chassis 102. Further, the flexible filter 130 is surrounded by the flexible frame 134 to allow easy replacement of a blocked flexible filter from the flexible filter assembly 106. In some examples, the flexible filter 130 may have a first height "$H_1$" along the first direction 10, which is substantially equal to a second height "$H_2$" of the chassis 102 along the first direction 10, to prevent the supply air 122A bypassing the flexible filter 130 to a first volume portion.

The flexible driver 132 is a driving element of the flexible filter assembly 106, which may steer the flexible filter 130 to move into and out of the internal volume 116 of the chassis 102. The flexible frame 134 includes a first end portion 134A, a second end portion 134B, and a pair of body portions 134C connecting the first end portion 134A and the second end portion 134B. The first end portion 134A, the second end portion 134B, and the pair of body portions 134C surrounds the flexible filter 130. A first end 132A of the flexible driver 132 is connected to the second end portion 134B of the flexible frame 134 and the second end 132B of the flexible driver 132 is connected to the handle 136. The handle 136 is a gripping element of the flexible filter assembly 106, which may be used to push or pull the flexible filter assembly 106 into or out of the chassis 102.

Each of the flexible filter 130, the flexible driver 132, and the flexible frame 134 are made of an elastic material, such as a polymer to allow the flexible filter assembly 106 to bend at the third curved section 120C of the pair of guide rails 104 when it slides into and out of the chassis 102. In some examples, the computing system 100 may additionally include a plurality of roller elements (e.g., cylindrical or ball-shaped members) between the flexible filter assembly 106 and the pair of guide rails 104, and disposed either at an outer surface of the pair of body portions 134C of the flexible frame 134 and flexible driver 132 or at the inner surface of the channel 118 of the pair of guide rails 104. The plurality of roller elements may reduce or eliminate a direct surface contact between the flexible filter assembly 106 and the pair of guide rails 104 (and create a roller contact between the flexible filter assembly 106 and the pair of guide rails 104 via the plurality of roller elements), and thereby reduce sliding friction between the flexible filter assembly 106 and the pair of guide rails 104.

Referring back to FIG. 1, the flexible filter assembly 106 slides into the chassis 102 along the pair of guide rails 104 to detachably connect to the chassis 102. The flexible filter assembly 106, when connected to the chassis 102, splits the internal volume into a first volume portion 116A and a second volume portion 116B. In some examples, the flexible filter 130 of the flexible filter assembly 106 is positioned between the first sections 120A of the pair of guide rails 104 and extends along the second direction 20 to split the internal volume 116 into the first volume portion 116A and the second volume portion 116B. In other words, the flexible filter 130 of the flexible filter assembly 106 may be positioned at the first offset distance "$D_1$" from the front side 124 of the chassis 102 to define: i) the second volume portion 116B between the front side 124 of the chassis 102 and the flexible filter assembly 106, and ii) the first volume portion 116A between the flexible filter assembly 106 and a rear side 138 of the chassis 102. In some examples, the first volume portion 116A is located downstream relative to a flow of supply air 122A into the chassis 102, and the second volume portion 116B is located upstream relative to the flow of supply air 122A into the chassis 102. In other words, the first volume portion 116A is located downstream relative to the flexible filter 130, and the second volume portion 116B is located upstream relative to the flexible filter 130. Since the flexible filter 130 of the flexible filter assembly 106 is located perpendicular to the direction of flow of supply air 122A into the chassis 102, the supply air 122A passing from the second volume portion 116B cannot bypass the flexible filter 130 and reach the first volume portion 116A.

Further, the flexible driver 132 of the flexible filter assembly 106 is positioned between the second sections 120B and third curved sections 120C of the pair of guide rails 104. A portion of the flexible driver 132 may extend along the third direction 30 and another portion of the flexible driver 132 may be curved from the third direction 30 to the second direction 20. The portion of the flexible driver 132 that extends along the third direction 30 may be adjacent to the second sidewall 110B of the pair of sidewalls 110, which is parallel to the flow of the supply air 122A, such that the portion of the flexible driver 132 that extends along the third direction 30 does not obstruct the flow of supply air 122A into the chassis 102. Further, the other portion of the flexible driver 132 that is curved from the third direction 30 to the second direction 20 may redirect the flow of supply air 122A towards the flexible filter 130.

The pair of body portions 134C of the flexible frame 134 is located within the channel 118 of the pair of guide rails 104. The first end portion 134A of the flexible frame 134 is located adjacent to a first sidewall 110A of the chassis 102. The second end portion 134B of the flexible frame 134 and the first end 132A of the flexible driver 132 are located adjacent to the second sidewall 110B. The second end of the flexible driver 132 is located adjacent to the front side 124 of the computing system 100. The handle 136 may have a width substantially greater than the width of the slot 126. Accordingly, the handle 136 may remain outside the chassis 102 at the front side 124 and be positioned adjacent to the second sidewall 110B of the chassis 102.

The plurality of first electronic components 108 is disposed in the first volume portion 116A and coupled to the chassis 102 via suitable fastening mechanisms (not shown). In some examples, the plurality of first electronic components 108 may include processors, memory, motherboards, and other electronic elements, such as capacitors, inductors, resistors, or the like, without deviating from the scope of the present disclosure. The plurality of first electronic components 108 are main components of the computing system 100, which are not frequently accessed physically from outside of the chassis 102.

In one or more embodiments, the flexible filter assembly 106 easily slides into or out of the internal volume 116 of the chassis 102 from outside of the chassis 102 via the slot 126, to detachably connect to the chassis 102. Since the flexible filter assembly 106 slides into the chassis 102 from outside of the chassis 102, the computing system 100 need not undergo shut down or be disassembled to connect the flexible filter assembly 106 to the chassis 102 or to disconnect a blocked flexible filter assembly from the chassis 102 of the computing system 100. In some examples, the term disassemble may refer to removing at least one of a cover, a front panel, or a rear panel of the chassis 102.

During the operation of the computing system 100, the plurality of first electronic components 108 may generate significant amounts of waste heat. In such examples, a plurality of heat sinks (not shown), which are disposed on the plurality of first electronic components 108 may absorb the waste heat from the first electronic components 108. The flexible filter 130 may filter the supply air 122A flowing along the third direction 30 by trapping dust 122B and generating clean air 122C. In such examples, the flexible filter 130 may direct the clean air 122C towards the plurality of first electronic components 108, for example, over the plurality of heat sinks to dissipate the waste heat from each of the plurality of first electronic components 108 via the plurality of heat sinks. Since the flexible filter 130 filters the supply air 122A, the dust 122B may not accumulate over the plurality of first electronic components 108 and/or the plurality of heat sinks.

FIG. 3A depicts a perspective front view of the portion of the computing system 100 of FIG. 1 having a plurality of second electronic components 140. FIG. 3B depicts a perspective front view of the portion of the computing system 100 of FIG. 3A having a front panel 112 disposed at a front side 124 of the computing system 100. In the description hereinafter, FIGS. 3A and 3B are described concurrently for ease of illustration.

The computing system 100 further includes a plurality of second electronic components 140 disposed in the second volume portion 116B of the chassis 102. In some examples, each of the plurality of second electronic components 140 is a hot-swappable component. In one or more examples, the hot-swappable component is a type of electronic device, which may be replaced or added to the computing system 100 without stopping, shutting down, or rebooting the electronic device. In other words, the hot-swappable component may be extracted from the chassis 102 and/or installed in the chassis 102, while other electronic components, e.g., the plurality of first electronic components 108, are disposed in the first volume portion 116A of the chassis 102 and continue to operate. The flexible filter assembly 106 connected to the chassis 102 at the first offset distance "$D_1$" from the front side 124 may allow the plurality of second electronic components 140 to remain accessible without a need to remove the flexible filter assembly 106 for accessing the plurality of second electronic components 140. In other words, the flexible filter assembly 106 located behind the plurality of second electronic components 140 in the chassis 102 may not obstruct the access to the hot-swappable components and provision the hot-swappable components to remain accessible from the front side 124 of the chassis 102.

Referring to FIG. 3B, the plurality of second electronic components 140 may remain accessible from the front side 124 of the computing system 100 by moving or lifting the front panel 112 of the computing system 100. For example, the front panel 112 is movably coupled to the chassis 102 via hinges 142. In the example of FIG. 3B, the hinges 142 are disposed at the front side 124 and along a top surface of the chassis 102. Thus, when the front panel 112 is lifted, it pivots relative to the hinges 142 to provide direct access to the plurality of second electronic components 140 disposed in the second volume portion 116B. Hence, the flexible filter assembly 106 may continue to remain in the internal volume 116 of the chassis 102, while the plurality of second electronic components 140 is accessed via the front side 124.

Referring back to FIG. 3A, as discussed herein, the second section 120B of each guide rail of the pair of guide rails 104 has an open end $120B_1$ disposed at the front side 124 of the chassis 102. In some examples, the open ends $120B_1$ of the pair of guide rails 104 may define a slot 126 at the front side 124 of the chassis 102. In such examples, the flexible filter assembly 106 may slide into or out of the chassis 102 via the slot 126.

Figure 4A:
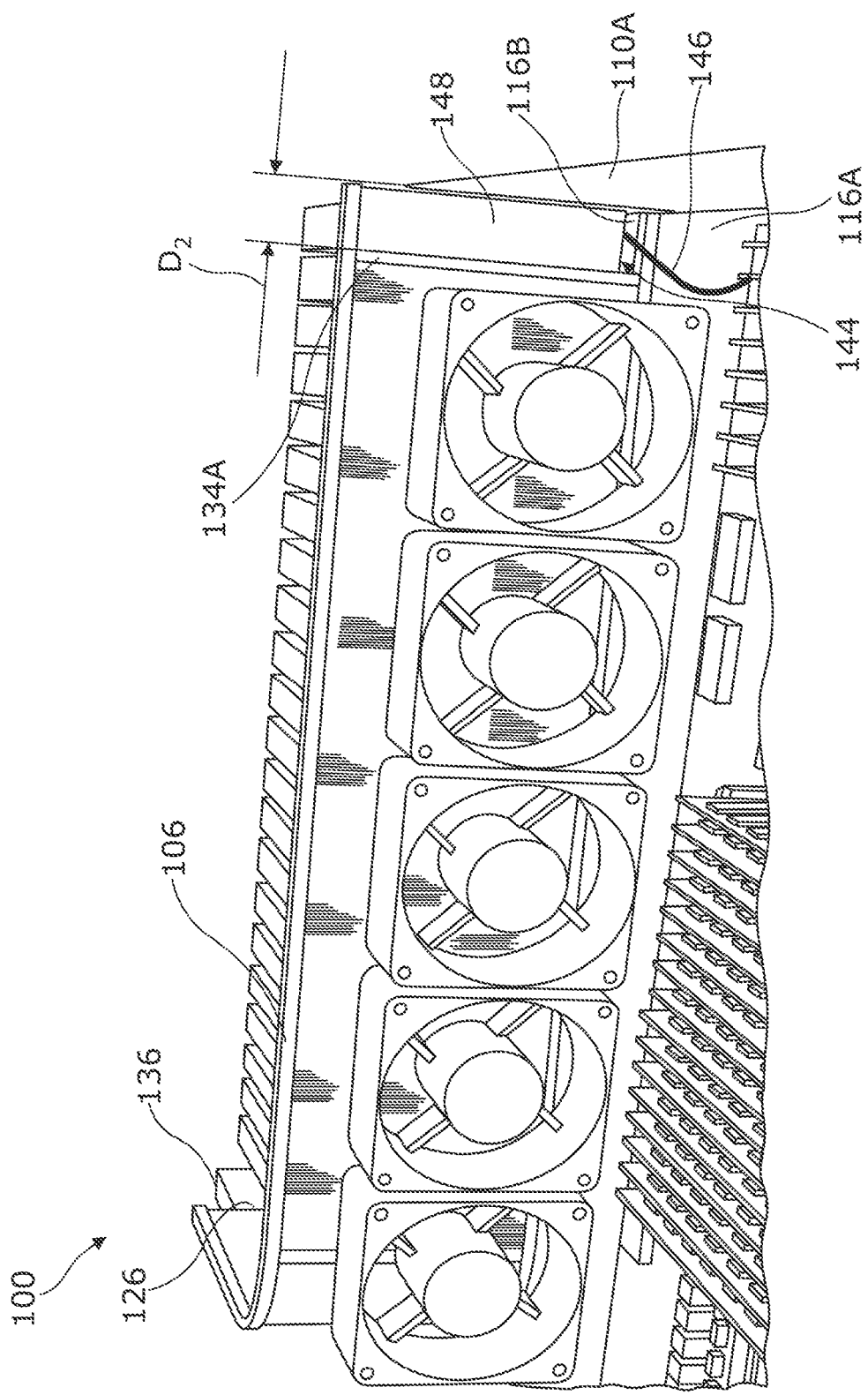
FIG. 4A illustrates a perspective rear view of the portion of the computing system of FIG. 1 having an opening defined between the flexible filter assembly and a sidewall of the computing system according to the example implementation of the present disclosure.
Figure 4B:
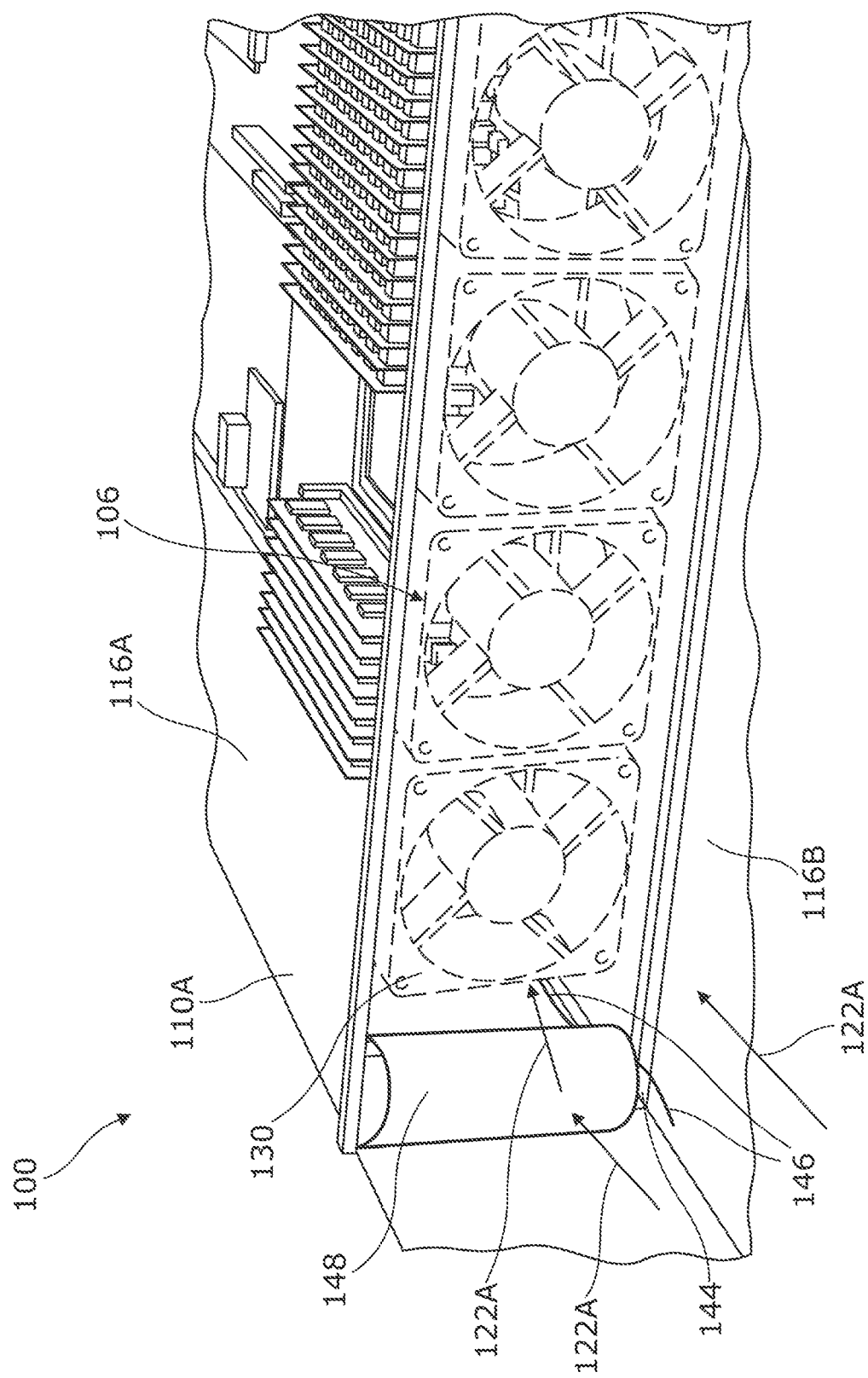
FIG. 4B illustrates a perspective front view of the portion of the computing system of FIG. 4A having an air baffle coupled to the sidewall according to the example implementation of the present disclosure.

FIG. 4A depicts a perspective rear view of the portion of the computing system 100 of FIG. 1 having an opening 144 defined between the flexible filter assembly 106 and a first sidewall 110A of the chassis 102. FIG. 4B depicts a perspective front of the portion of the computing system 100 of FIG. 4A having an air baffle 148 coupled to the first sidewall 110A. In the description hereinafter, FIGS. 4A and 4B are described concurrently for ease of illustration.

In some examples, when the flexible filter assembly 106 slides into the chassis 102, the first end portion 134A of the flexible frame 134 may stop at a second offset distance "$D_2$" from the first sidewall 110A of the chassis 102, since the handle 136 contacts the slot 126. Accordingly, the second offset distance "$D_2$" defines the opening 144 between the first end portion 134A of the flexible frame 134 and the first sidewall 110A of the chassis 102. In some examples, one or more cables 146 of the computing system 100 are routed between the first volume portion 116A and the second volume portion 116B via the opening 144. In some examples, the computing system 100 may further include an air baffle 148 covering a substantial portion of the opening 144. In some examples, the air baffle 148 may substantially cover about 90 percent of the opening 144 and may leave open about 10 percent of the opening 144 to allow the passage of cables 146 between the first volume portion 116A and the second volume portion 116B. It will be understood that the air baffle 148 may cover 85 percent, 95 percent, or any suitable percentage of opening 144 to direct airflow and also allow passage of cables 146 through the opening 144.

Referring to FIG. 4B, the air baffle 148 is coupled to the first sidewall 110A. Further, the air baffle 148 is a curved element having a curvature pointing towards the flexible filter 130. In such examples, the air baffle 148 redirects the flow of the supply air 122A moving along the opening 144 towards the flexible filter 130 of the flexible filter assembly 106. Thus, the supply air 122A cannot bypass the flexible filter 130 through the opening 144. Accordingly, the supply air 122A directed towards the flexible filter 130 is filtered by trapping dust 122B contained in the supply air 122A and clean air 122C is directed towards the plurality of first electronic components 108 disposed in the first volume portion 116A.

Figure 5:
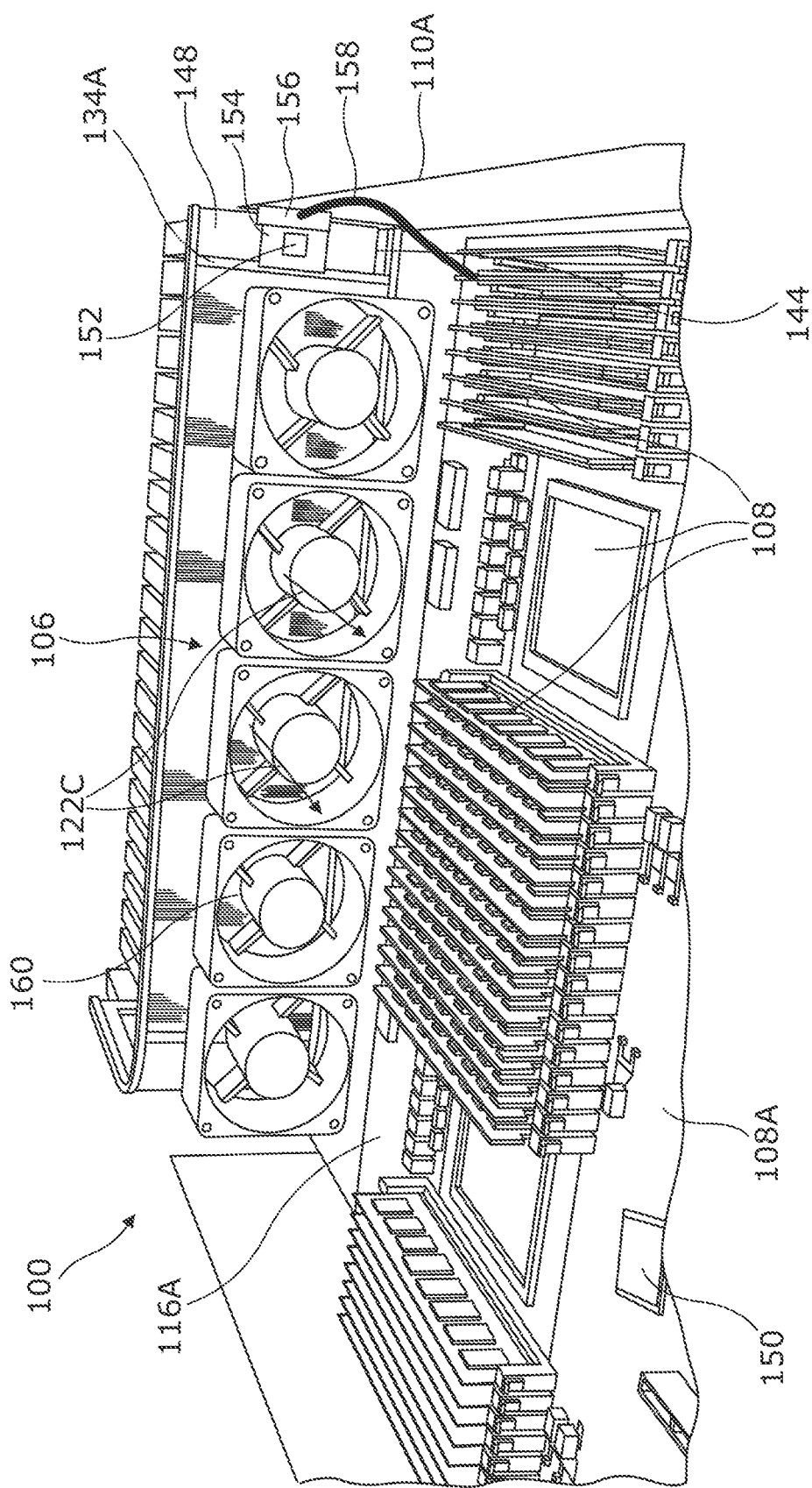
FIG. 5 illustrates a perspective rear view of the portion of the computing system of FIG. 1 having a manageability controller and a microcontroller coupled to the flexible filter assembly according to the example implementation of the present disclosure.

FIG. 5 depicts a perspective rear view of the portion of the computing system 100 of FIG. 1, where the computing system 100 further includes a manageability controller 150 and a microcontroller 152.

The manageability controller 150 is disposed in the first volume portion 116A. In particular, the manageability controller 150 is coupled to a motherboard 108A among the plurality of first electronic components 108. In some examples, the manageability controller 150 is a baseboard management controller (BMC).

The microcontroller 152 is connected to the flexible filter assembly 106. In particular, the computing system includes an electronic plug 154 connected to a first end portion 134A of the flexible frame 134. In such examples, the microcontroller 152 is embedded within the electronic plug 154. Further, the computing system 100 includes an electronic socket 156 connected to the first sidewall 110A of the chassis 102. The electronic socket 156 may be disposed facing the electronic plug 154. The electronic socket 156 is further connected to the motherboard 108A of the computing system 100 via cable 158. In some examples, the electronic socket 156 is communicatively connected to the manageability controller 150 via the cable 158, and traces (not shown) formed in the motherboard 108A. In some other examples, the electronic socket 156 may be communicatively connected to the manageability controller 150 via a complex programmable logic device (CPLD, not shown), which may also be coupled to the motherboard 108A. In such examples, the CPLD may interconnect the electronic socket 156 to the motherboard 108A via cable 158, and traces formed in the motherboard 108A. In certain examples, the microcontroller 152 may send signals to the manageability controller 150 via the inter-integrated circuit (i2C) protocol, or the like. In one or more examples, when the flexible filter assembly 106 slides into internal volume 116 of the chassis 102 via the pair of guide rails 104, the electronic plug 154 is inserted into the electronic socket 156 to establish the connection between the microcontroller 152 and the manageability controller 150.

The microcontroller 152 tracks an active runtime of the computing system 100 and sends a signal that indicates the active runtime of the computing system 100 to the manageability controller 150. As used herein the term "active runtime" may refer to a non-idle time of the computing system 100. In other words, the active runtime is calculated based on runtime of the computing system 100 for executing one or more workloads. Therefore, the active runtime is not based on an idle time of the computing system 100, such as a sleep mode or hibernation mode or the like, where the computing system 100 is not executing any workloads. During active runtime, the computing system 100 may generate substantial amounts of waste heat, and one or more fans 160 may operate at its full capacity to draw clean air 122C through the flexible filter assembly 106 and blow over the plurality of first electronic components 108 (and heat sinks) to dissipate the significant amount of waste heat. However, during the idle runtime, the computing system 100 may not generate substantial amounts of waste heat. Hence, the one or more fans 160 may not operate at full capacity to draw clean air 122C through the flexible filter assembly 106. Therefore, the flexible filter assembly 106 may not filter the maximum amount of dust 122B in the supply air 122A, and the flexible filter 130 may remain unblocked from dust 122B for a longer duration.

The manageability controller 150 compares the active runtime of the computing system 100 with a threshold runtime to determine when to trigger a service event alert. In some examples, the threshold runtime may be stored in a memory (not shown) of the manageability controller 150. The threshold runtime may be a pre-determined value of time that is based on evaluating a plurality of test runtimes of the computing system 100 for replacing the flexible filter 130. In other words, the threshold runtime may function as a time indicator for replacing the flexible filter 130. In such examples, the manageability controller 150, based on (e.g., in response to) determining that the active runtime exceeds the threshold runtime, triggers the service event alert to replace the flexible filter 130. In some examples, the service event alert may be sent to one or more client devices (not shown), such as a data center management system, a mobile phone, an email client, or the like. Upon receipt of such service event alert, the customer or administrator of the computing system 100 may pull the flexible filter assembly 106 out of the chassis 102, from outside of the chassis 102 without powering down or disassembling the computing system 100. Since the manageability controller 150 triggers the service event alert to replace the flexible filter assembly 106, the computing system 100 need not undergo a forced shut down due to overheating of the first electronic components 108 that is caused by blocks in the flexible filter 130.

Figure 6:
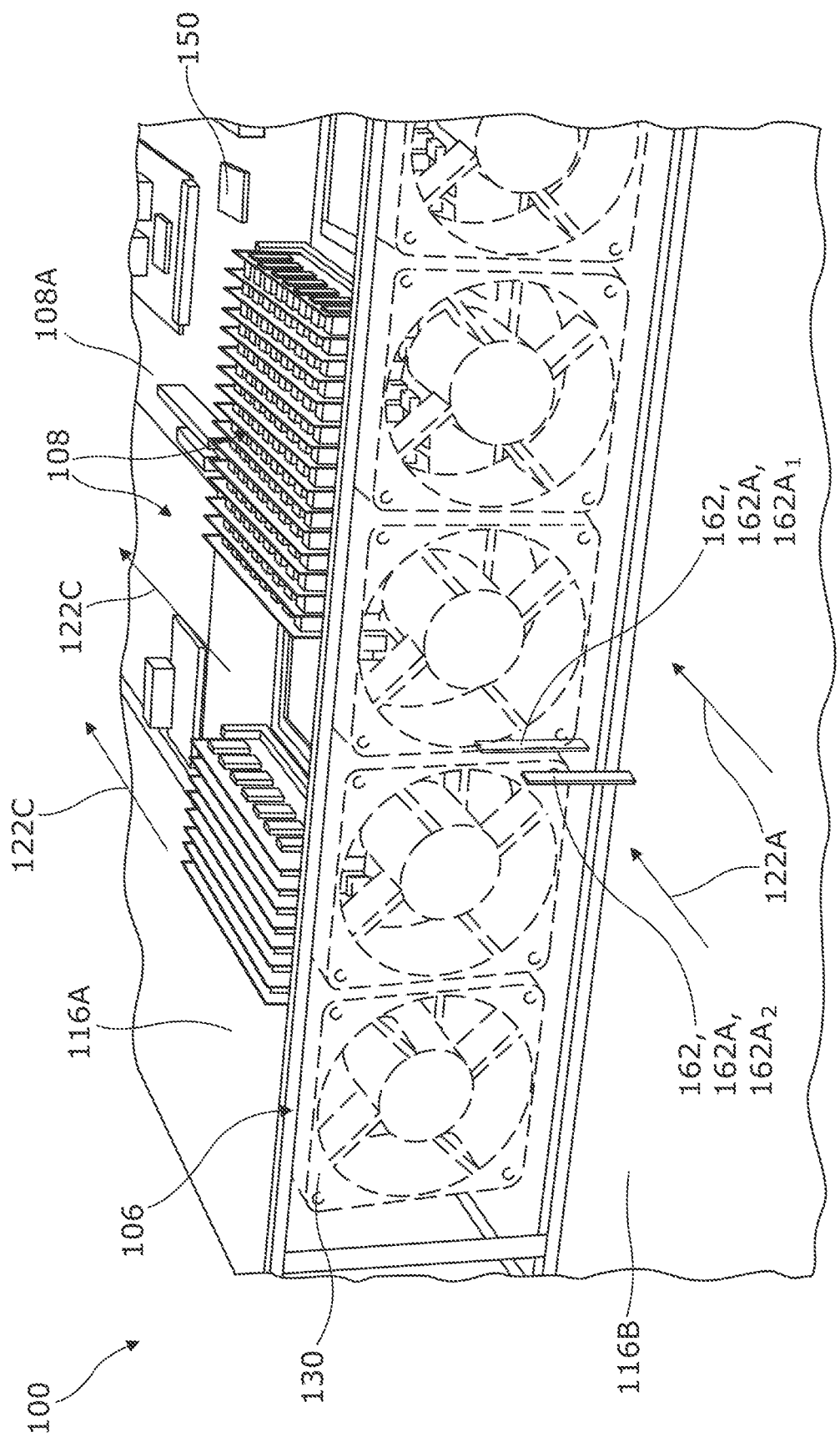
FIG. 6 illustrates a perspective front view of the portion of the computing system of FIG. 1 having a manageability controller and a plurality of sensors according to the example implementation of the present disclosure.
Figure 7:
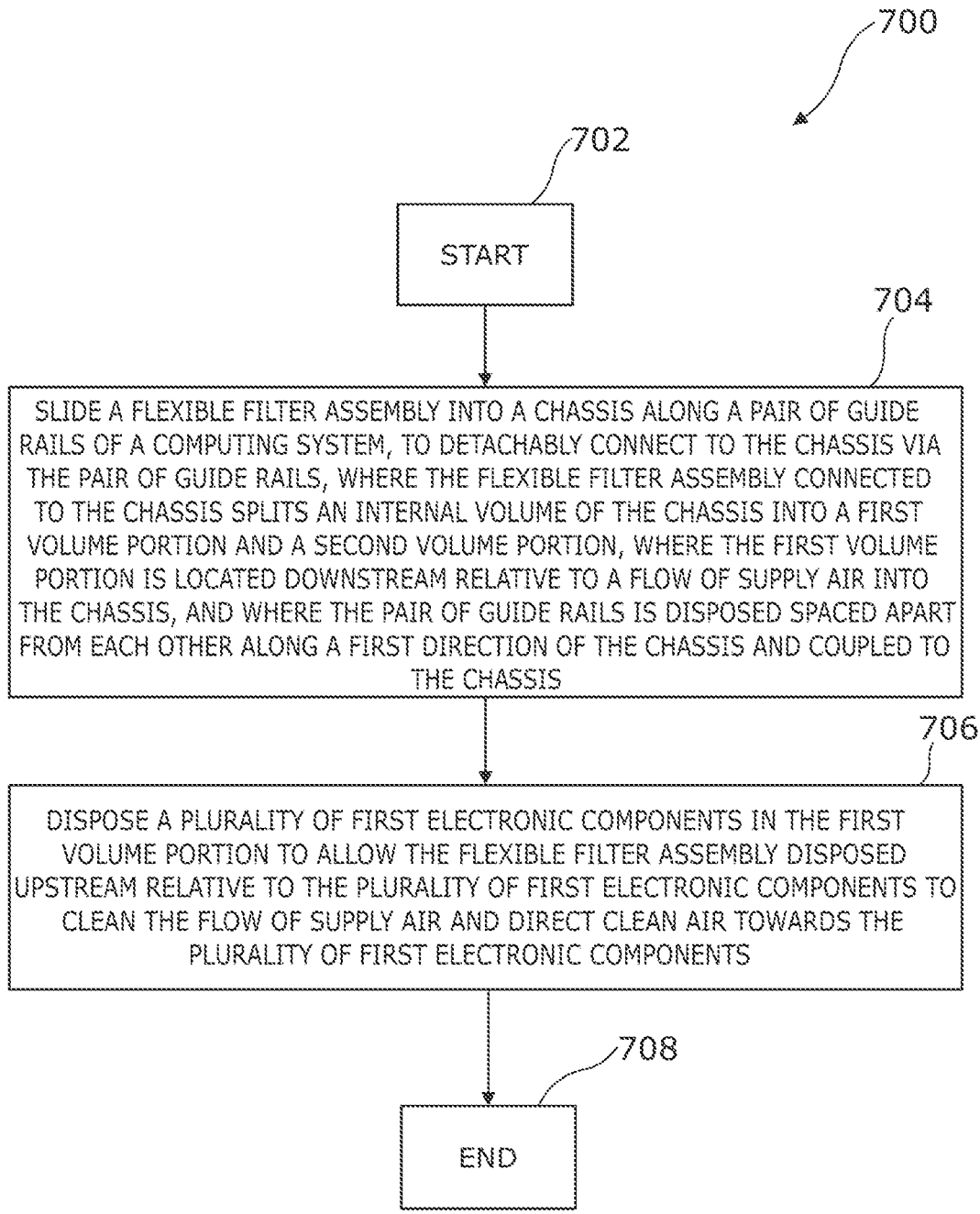
FIG. 7 illustrates a flowchart depicting a method of detachably connecting a flexible filter assembly to a computing system according to an example implementation of the present disclosure.

FIG. 6 depicts a perspective front view of the portion of the computing system 100 of FIG. 1, where the computing system 100 further includes a manageability controller 150 and a plurality of sensors 162. In the example of FIG. 6, the plurality of sensors 162 may be a plurality of airflow sensors 162A. The plurality of airflow sensors 162A includes a first airflow sensor $162A_1$ disposed in the first volume portion 116A and a second airflow sensor $162A_2$ disposed in the second volume portion 116B. For example, the first airflow sensor $162A_1$ may be disposed downstream of the flexible filter 130 and the second airflow sensor $162A_2$ may be disposed upstream of the flexible filter 130. As discussed herein the manageability controller 150 may be communicatively coupled to the first airflow sensor $162A_1$ and the second airflow sensor $162A_2$ via cables and traces (not shown) in the motherboard 108A.

The first airflow sensor $162A_1$ may detect a first speed of the clean air 122C in the first volume portion 116A and generate a first signal that indicates the first speed of the clean air 122C in the first volume portion 116A. Similarly, the second airflow sensor $162A_2$ may detect a second speed of the supply air 122A in the second volume portion 116B and generate a second signal that indicates the second speed of the supply air 122A in the second volume portion 116B. In some examples, the manageability controller 150 receives the first signal from the first airflow sensor $162A_1$ and the second signal from the second airflow sensor $162A_2$. In one or more examples, the first speed of the clean air 122C may be substantially reduced when the flexible filter 130 gets blocked (as compared to when the flexible filter 130 is unblocked). The manageability controller 150 compares a difference between the second speed and the first speed with a threshold speed to determine when to trigger a service event alert. In some examples, the threshold speed may be stored in a memory (not shown) of the manageability controller 150. The threshold speed may be a pre-determined value of speed that is based on evaluating a plurality of test speeds of the computing system 100 for replacing the flexible filter 130. In other words, the threshold speed may function as a time window indicator for replacing the flexible filter 130. In such examples, the manageability controller 150, based on (e.g., in response to) determining that the difference between the second speed and the first speed is less than the threshold speed, triggers the service event alert to replace the flexible filter 130. In some examples, the service event alert may be sent to one or more client devices (not shown), such as a data center management system, a mobile phone, an email client, or the like. Upon receipt of such service event alert, the customer or administrator of the computing system 100 may pull the flexible filter assembly 106 out of the chassis 102, from outside of the chassis 102 without powering down or disassembling the computing system 100. Since the manageability controller 150 triggers the service event alert to replace the flexible filter assembly 106, the computing system 100 need not undergo a forced shut down due to overheating of the first electronic components 108 that is caused by blocks in the flexible filter 130.

In some other examples, the plurality of sensors 162 may be temperature sensors. The plurality of temperature sensors may include a first temperature sensor and a second temperature sensor, which may be disposed in the first volume portion 116A and the second volume portion 116B respectively. As discussed herein the manageability controller 150 may be communicatively coupled to the first temperature sensor and the second temperature sensor via cables and traces (not shown) in the motherboard 108A.

The first temperature sensor may detect a first temperature of the clean air 122C in the first volume portion 116A and generate a first signal that indicates the first temperature of the clean air 122C in the first volume portion 116A. Similarly, the second temperature sensor may detect a second temperature of the supply air 122A in the second volume portion 116B and generate a second signal that indicates the second temperature of the supply air 122A in the second volume portion 116B. In some examples, the manageability controller 150 may receive the first signal from the first air temperature sensor and the second signal from the second temperature sensor. In one or more examples, the first temperature of the clean air 122C may be substantially greater, when the flexible filter 130 gets blocked (as compared to when the flexible filter 130 is unblocked). The manageability controller 150 may compare a difference between the second temperature and the first temperature with a threshold temperature to determine when to trigger a service event alert. In some examples, the manageability controller 150, based on (e.g., in response to) determining that the difference between the second temperature and the first temperature is greater than the threshold temperature, may trigger the service event alert to replace the flexible filter 130. Upon receipt of such service event alert, the customer or administrator of the computing system 100 may pull the flexible filter assembly 106 out of the chassis 102, from outside of the chassis 102 without powering down or disassembling the computing system 100. Since the manageability controller 150 triggers the service event alert to replace the flexible filter assembly 106, the computing system 100 need not undergo the forced shut down because of overheating of the first electronic components 108 due to blocks in the flexible filter 130.

FIG. 7 depicts a flowchart depicting a method 700 of detachably connecting a flexible filter assembly to a computing system. It should be noted herein that the method 700 is described in conjunction with FIGS. 1-2, FIGS. 3A-3B, and FIGS. 4A-4B for example.

The method 700 starts at block 702 and continues to block 704. At block 704, the method 700 includes sliding a flexible filter assembly into a chassis along a pair of guide rails of a computing system, to detachably connect to the chassis via the pair of guide rails. In some examples, when the flexible filter assembly is connected to the chassis, it splits an internal volume of the chassis into a first volume portion and a second volume portion. In such examples, the first volume portion is located downstream relative to a flow of supply air into the chassis. Further, the pair of guide rails are disposed spaced apart from each other along a first direction of the chassis and coupled to the chassis.

In some examples, sliding the flexible filter assembly includes pushing the flexible filter assembly into the chassis or pulling the flexible filter assembly out of the chassis via a slot defined in the chassis by the pair of guide rails. In such examples, each guide rail of the pair of guide rails includes a first section extending along a second direction of the chassis, a second section extending along a third direction of the chassis that is perpendicular to the second direction, and a third curved section interconnecting the first and second sections. Further, the second section of each guide rail has an open end. The open ends of the pair of guide rails define the slot in the chassis. In some examples, sliding the flexible filter assembly further includes pushing the flexible filter assembly into the chassis to position a flexible filter of the flexible filter assembly between the first sections of the pair of guide rails and extend the flexible filter along the second direction to split the internal volume into the first and second volume portions. The plurality of first electronic components is disposed in the first volume portion. In some examples, sliding the flexible filter assembly further includes sliding the flexible filter assembly into the chassis from outside the chassis to detachably connect to the chassis without a need to power down the computing system or remove at least one of a cover, a front panel, or a rear panel of the chassis to access an internal volume of the chassis. The method 700 continues to block 706.

At block 706, the method 700 includes disposing a plurality of first electronic components in the first volume portion to allow the flexible filter assembly disposed upstream relative to the plurality of first electronic components to clean the flow of supply air and direct clean air towards the plurality of first electronic components. In some examples, the flexible filter receives the supply air from an air inlet side (e.g., a front side) of the computing system and traps dust from the supply air and generates clean air.

The method 700 further includes disposing a plurality of second electronic components in the second volume portion. In some examples, each of the plurality of second electronic components is a hot-swappable electronic component, such as hard drives, fans, or the like. In such examples, the flexible filter assembly connected at an offset distance from a front side of the chassis may allow the plurality of second electronic components to remain accessible via the front side of the chassis.

The method 700 further includes defining an opening between an end portion of the flexible filter assembly and a sidewall of the chassis to allow routing of one or more cables of the computing system between the first volume portion and the second volume portion via the opening. Further, the method 700 includes coupling an air baffle to the sidewall covering the opening to redirect the flow of supply air moving along the opening towards the flexible filter assembly.

The method 700 further includes detecting a first speed of the clean air in the first volume portion by a first airflow sensor disposed in the first volume portion and generating a first signal by the first airflow sensor. Further, the method 700 includes detecting a second speed of the supply air in the second volume portion by a second airflow sensor disposed in the second volume portion and generating a second signal by the second airflow sensor. The method 700 further includes a manageability controller receiving the first signal and the second signal from the first airflow sensor and the second airflow sensor respectively. The method 700 further includes the manageability controller triggering a service event alert to replace the flexible filter assembly in response to determining that a difference between the second speed and the first speed is lesser than a threshold speed.

In some examples, method 700 further includes detecting a first temperature of the clean air in the first volume portion by a first temperature sensor disposed in the first volume portion and generating a first signal that indicates the first temperature. Further, the method 700 includes detecting a second temperature of the supply air in the second volume portion by a second temperature sensor disposed in the second volume portion and generating a second signal that indicates the second temperature. The method 700 further includes the manageability controller receiving the first signal and second signal from the first temperature sensor and the second temperature sensor respectively. The method 700 further includes the manageability controller triggering a service event alert to replace the flexible filter assembly in response to determining that a difference between the second temperature and the first temperature is greater than a threshold temperature.

In some other examples, the method 700 further includes generating a signal that indicates an active runtime of the computing system by a microcontroller coupled to the flexible filter assembly. The method 700 further includes the manageability controller receiving the signal from the microcontroller. The method 700 further includes the manageability controller triggering a service event alert to replace the flexible filter assembly in response to determining that the active runtime exceeds a threshold runtime of the computing system. The method 700 ends at block 708.

Various features as illustrated in the examples described herein may be implemented in a computing system having a flexible filter assembly. Since the flexible filter assembly slides into the chassis to detachably connect to the chassis of the computing system from outside of the chassis, the computing system need not undergo shut down or be disassembled to connect the flexible filter assembly to the chassis of the computing system. Further, since the flexible filter assembly is located at the offset distance from the front side of the computing system, it may allow the plurality of second electronic components (i.e., hot-swappable components) to be easily installed in the second volume portion and remain accessible via the front side of the chassis. Additionally, since the manageability controller triggers the service event alert to replace the flexible filter assembly, the computing system may avoid shut down due to a blocked filter, which would otherwise increase the likelihood of overheating of the first electronic components if unreplaced.

In the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. A computing system comprising:
   a chassis having an internal volume;
   a pair of guide rails disposed spaced apart from each other along a first direction of the chassis and coupled to the chassis;
   a flexible filter assembly disposed within the chassis and connected to the chassis via the pair of guide rails, wherein the flexible filter assembly splits the internal volume into a first volume portion and a second volume portion, wherein the first volume portion is located downstream relative to a flow of supply air into the chassis, and wherein the flexible filter assembly slides into the chassis along the pair of guide rails to detachably connect to the chassis; and
a plurality of first electronic components disposed in the first volume portion and coupled to the chassis, wherein the flexible filter assembly cleans the flow of supply air and directs clean air towards the plurality of first electronic components.

2. The computing system of claim 1, wherein each guide rail of the pair of guide rails comprises a first section extending along a second direction of the chassis, a second section extending along a third direction of the chassis that is perpendicular to the second direction, and a third curved section interconnecting the first and second sections.

3. The computing system of claim 2, wherein the second section of each guide rail has an open end, wherein the open ends of the pair of guide rails define a slot in the chassis, and wherein the flexible filter assembly slides into or out of the chassis via the slot.

4. The computing system of claim 2, wherein the flexible filter assembly comprises a flexible filter, a flexible driver connected to the flexible filter, a flexible frame surrounding the flexible filter, and a handle connected to the flexible driver, wherein the flexible filter is positioned between the first sections of the pair of guide rails and extends along the second direction to split the internal volume into the first and second volume portions, and wherein the plurality of first electronic components is disposed in the first volume portion.

5. The computing system of claim 4, further comprising a plurality of second electronic components disposed in the second volume portion and coupled to the chassis, wherein each of the plurality of second electronic components is a hot-swappable electronic component.

6. The computing system of claim 5, wherein the flexible filter assembly connected to the chassis allows the plurality of second electronic components to remain accessible via a front side of the chassis.

7. The computing system of claim 1, further comprising an opening defined between an end portion of the flexible filter assembly and a sidewall of the chassis and an air baffle coupled to the sidewall covering the opening, wherein one or more cables of the computing system are routed between the first volume portion and the second volume portion via the opening, and wherein the air baffle redirects the flow of the supply air moving along the opening towards the flexible filter assembly.

8. The computing system of claim 1, further comprising a first airflow sensor disposed in the first volume portion, a second airflow sensor disposed in the second volume portion, and a manageability controller communicatively coupled to the first and second airflow sensors, wherein the manageability controller receives a first signal from the first airflow sensor that indicates a first speed of the clean air in the first volume portion and a second signal from the second airflow sensor that indicates a second speed of the supply air in the second volume portion, and wherein the manageability controller triggers a service event alert to replace the flexible filter assembly in response to determining that a difference between the second speed and the first speed is lesser than a threshold speed.

9. The computing system of claim 1, further comprising a first temperature sensor disposed in the first volume portion, a second temperature sensor disposed in the second volume portion, and a manageability controller communicatively coupled to the first and second temperature sensors, wherein the manageability controller receives a first signal from the first temperature sensor that indicates a first temperature of the clean air in the first volume portion and a second signal from the second temperature sensor that indicates a second temperature of the supply air in the second volume portion, and wherein the manageability controller triggers a service event alert to replace the flexible filter assembly in response to determining that a difference between the second temperature and the first temperature is greater than a threshold temperature.

10. The computing system of claim 1, further comprising a microcontroller coupled to the flexible filter assembly and a manageability controller communicatively coupled to the microcontroller, wherein the microcontroller tracks an active runtime of the computing system and sends a signal that indicates the active runtime of the computing system to the manageability controller, and wherein the manageability controller triggers a service event alert to replace the flexible filter assembly in response to determining that the active runtime exceeds a threshold runtime of the computing system.

11. The computing system of claim 1, wherein the flexible filter assembly slides into the chassis from outside of the chassis to detachably connect to the chassis without powering down the computing system or removing at least one of a cover, a front panel, or a rear panel of the chassis to access the internal volume.

12. A method comprising:
sliding a flexible filter assembly into a chassis along a pair of guide rails of a computing system, to detachably connect to the chassis via the pair of guide rails,
wherein the flexible filter assembly connected to the chassis splits an internal volume of the chassis into a first volume portion and a second volume portion, wherein the first volume portion is located downstream relative to a flow of supply air into the chassis, and wherein the pair of guide rails are disposed spaced apart from each other along a first direction of the chassis and coupled to the chassis; and
disposing a plurality of first electronic components in the first volume portion to allow the flexible filter assembly disposed upstream relative to the plurality of first electronic components to clean the flow of supply air and direct clean air towards the plurality of first electronic components.

13. The method of claim 12, wherein sliding the flexible filter assembly comprises pushing the flexible filter assembly into the chassis or pulling the flexible filter assembly out of the chassis via a slot defined in the chassis by the pair of guide rails, wherein each guide rail of the pair of guide rails comprises a first section extending along a second direction of the chassis, a second section extending along a third direction of the chassis that is perpendicular to the second direction, and a third curved section interconnecting the first and second sections, wherein the second section of each guide rail has an open end, and wherein the open ends of the pair of guide rails define the slot in the chassis.

14. The method of claim 13, wherein sliding the flexible filter assembly comprises pushing the flexible filter assembly into the chassis to position a flexible filter of the flexible filter assembly between first sections of the pair of guide rails and extend the flexible filter along the second direction to split the internal volume into the first and second volume portions, and wherein the plurality of first electronic components is disposed in the first volume portion.

15. The method of claim 12, further comprising disposing a plurality of second electronic components in the second volume portion, and wherein each of the plurality of second electronic components is a hot-swappable electronic component, wherein the flexible filter assembly connected to the chassis allows the plurality of second electronic components to remain accessible via a front side of the chassis.

16. The method of claim 12, further comprising:
defining an opening between an end portion of the flexible filter assembly and a sidewall of the chassis to allow routing of one or more cables of the computing system between the first volume portion and the second volume portion via the opening; and
coupling an air baffle to the sidewall covering the opening to redirect the flow of supply air moving along the opening towards the flexible filter assembly.

17. The method of claim 12, further comprising a first airflow sensor disposed in the first volume portion, a second airflow sensor disposed in the second volume portion, and a manageability controller communicatively coupled to the first and second airflow sensors, wherein the manageability controller receives a first signal from the first airflow sensor that indicates a first speed of clean air in the first volume portion and a second signal from the second airflow sensor that indicates a second speed of the supply air in the second volume portion, and wherein the manageability controller triggers a service event alert to replace the flexible filter assembly in response to determining that a difference between the second speed and the first speed is lesser than a threshold speed.

18. The method of claim 12, further comprising a first temperature sensor disposed in the first volume portion, a second temperature sensor disposed in the second volume portion, and a manageability controller communicatively coupled to the first and second temperature sensors, wherein the manageability controller receives a first signal from the first temperature sensor that indicates a first temperature of clean air in the first volume portion and a second signal from the second temperature sensor that indicates a second temperature of the supply air in the second volume portion, and wherein the manageability controller triggers a service event alert to replace the flexible filter assembly in response to determining that a difference between the second temperature and the first temperature is greater than a threshold temperature.

19. The method of claim 12, further comprising a microcontroller coupled to the flexible filter assembly and a manageability controller communicatively coupled to the microcontroller, wherein the microcontroller tracks an active runtime of the computing system and sends a signal that indicates the active runtime of the computing system to the manageability controller, and wherein the manageability controller triggers a service event alert to replace the flexible filter assembly in response to determining that the active runtime exceeds a threshold runtime of the computing system.

20. The method of claim 12, wherein sliding the flexible filter assembly comprises sliding the flexible filter assembly into the chassis from outside the chassis to detachably connect to the chassis without a need to power down the computing system or remove at least one of a cover, a front panel, or a rear panel of the chassis to access the internal volume of the chassis.

\* \* \* \* \*